US006906565B2

(12) United States Patent
Keaveney (10) Patent No.: US 6,906,565 B2
(45) Date of Patent: Jun. 14, 2005

(54) FAST LOCK PHASE LOCK LOOP AND METHOD THEREOF

(75) Inventor: Michael F. Keaveney, Lisnagry (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/874,646

(22) Filed: Jun. 23, 2004

(65) Prior Publication Data

US 2005/0030072 A1 Feb. 10, 2005

Related U.S. Application Data

(60) Provisional application No. 60/483,411, filed on Jun. 27, 2003, and provisional application No. 60/544,439, filed on Feb. 14, 2004.

(51) Int. Cl.$^7$ ................................................ H03L 7/06
(52) U.S. Cl. .................................... 327/147; 327/156
(58) Field of Search ................................. 327/147, 148, 327/156, 157, 163; 331/17, 25, DIG. 2; 375/373, 374, 375, 376

(56) References Cited

U.S. PATENT DOCUMENTS

| | | | |
|---|---|---|---|
| 4,156,855 A | 5/1979 | Crowley | ..................... 331/1 A |
| 5,590,157 A | * 12/1996 | Schuur | ....................... 375/327 |
| 6,111,470 A | 8/2000 | Dufour | ......................... 311/17 |
| 6,842,399 B2 | * 1/2005 | Harrison | ..................... 365/233 |

OTHER PUBLICATIONS

Rhee, W., "Design of High–Performance CMOS Charge Pums in Phase–Locked Loops", IEEE International Symposium on Circuits and Systems (ISCAS), 1999, vol. 2, pp. 545–548.

"An Analysis and Performance Evaluation of a Passive Filter Design Technique for Charge Pump PLL's", National Semiconductor Application Note 1001, Jul. 2001, pp. 1–8.
Byrd, et al."A Fast Locking Scheme for PLL Frequency Synthesizers", National Semiconductor Application Note 1000, Jul. 1995, pp. 1–6.
Curtin et al., "Phase Locked Loops for High–Frequency Receivers and Transmitters–Part 3", Analog Dialogue 33–7 (1999), pp. 1–5.
Rhee et al., "A 1.1–GHz CMOS Fractional–$N$ Frequency Synthesizer with a 3–b Third–Order Delta Sigma Modulator"; IEEE Journal of Solid–State Circuits, vol. 35, No. 10, Oct. 2000, pp 1453–1460.
Greshishchev et al., "SiGe Clock and Data Recovery IC with Linear–Type PLL for 10–Gb/s SONET Application"; IEEE Journal of Solid–State Circuits, vol. 35, No. 9, Sep. 2000, pp 1353–1359.
Bastos et al., "A 12–Bit Intrinsic Accuracy High–Speed CMOS DAC"; IEEE Journal of Solid–State Circuits, Vo. 33, No. 12, Dec. 1998, pp. 1959–1969.

* cited by examiner

Primary Examiner—Linh My Nguyen
(74) Attorney, Agent, or Firm—Iandiorio & Teska (57) ABSTRACT

A fast lock phase lock loop (PLL) with minimal phase disturbance when switching from wide bandwidth mode to narrow bandwidth mode including a phase frequency detector, a charge pump, a loop filter and a voltage controlled oscillator, and a sequencer circuit for, at a first time, initiating an increase in the charge pump current to increase the loop gain to widen the loop bandwidth and initiating a decrease in the resistance in the loop filter to increase the phase margin of the PLL in the wide bandwidth mode; at a second time, initiating a reduction in the charge pump current to reduce the loop gain and bandwidth, and; at a third time, initiating an increase in the resistance in the loop filter to increase the phase margin of the PLL in the narrow bandwidth mode.

19 Claims, 6 Drawing Sheets

FAST LOCK PHASE LOCK LOOP AND METHOD THEREOF

RELATED APPLICATIONS

This application claims benefit of U.S. Provisional Application No. 60/483,411, filed Jun. 27, 2003, and U.S. Provisional Application No. 60/544,439, filed Feb. 14, 2004, both incorporated by reference herein.

FIELD OF THE INVENTION

This invention relates to an improved fast lock phase lock loop (PLL) and method.

BACKGROUND OF THE INVENTION

GMS and EDGE base stations require PLL synthesizers that can frequency hop over the full transmit or receive band (e.g., 75 MHz) in less than about 10 μs and also have very low phase noise and spurious tones. Conventional designs typically overcome these conflicting requirements with a "ping-pong" architecture which utilizes two narrow bandwidth PLLs wherein one PLL is locking to the next desired frequency while the other PLL is active as the synthesizer for the current burst. However, the ping-pong type design requires two PLL chips, two high performance VCOs and about 100 dB of isolation between the PLLs which is expensive and bulky.

Examples of fast locking PLLs which attempt to overcome the problems associated with the ping-pong type architecture are disclosed in U.S. Pat. Nos. 4,156,855 and 5,420,545, both incorporated by reference herein. The '855 and the '545 patents disclose fast locking PLLs where the bandwidth is increased to speed up the lock time by increasing the charge pump current and at the same time a switch is closed to short out part of the loop filter zero resistance. Increasing the charge pump current by a factor of N while reducing the loop filter resistance by $\sqrt{N}$ increases the loop bandwidth by $\sqrt{N}$ while leaving the phase margin unchanged. For example, to increase the loop bandwidth by a factor of 8 for wide bandwidth mode, the charge pump current may be increased by a factor of 64 while the loop filter resistance is decreased by a factor of 8. Similarly, to decrease the loop bandwidth to narrow bandwidth mode, the charge pump current may be reduced by a factor of 64 while the loop filter resistance is increased by a factor of 8. In these prior art designs, when the PLL has locked or is close to lock, the loop bandwidth is reduced again to reduce phase noise and spurious by reducing the charge pump current to the charge pump's minimum value and simultaneously opening the loop filter switch to increase the zero resistance again to restore the phase margin. These prior art designs all suffer from an excessively large disturbance to the frequency and phase settling transients when the bandwidth is reduced. This disturbance takes a long time to settle out since the bandwidth is reduced and the loop time constants have increased. The major cause of this disturbance is that the current flowing in the loop filter resistor can still be large when the loop filter resistance is increased. This is particularly the case with a fractional-N PLL which settles with an average phase error of zero but with an instantaneous error at the PFD that may have peak deviations up to ±4 RF periods. This gives rise to significant current pulses through the loop filter resistor. If the resistance is increased while current is flowing through the loop filter there will be a corresponding voltage increase seen across the resistor. This voltage step will appear on the VCO tuning voltage and the result is that excessive phase disturbance is generated and an output phase shift occurs which is greater than the ±5° limits required for GMS and EDGE applications.

Moreover, the '545 patent discloses that the reference and feedback divider values are also changed when the loop reverts from wide bandwidth to narrow bandwidth modes. The phase change associated with this technique takes an excessively long time to settle out when the loop is in narrow bandwidth mode.

BRIEF SUMMARY OF THE INVENTION

It is therefore an object of this invention to provide an improved fast lock PLL and method.

It is a further object of this invention to provide such an improved fast lock PLL and method which reduces the phase disturbance when switching between wide and narrow bandwidth.

It is a further object of this invention to provide such an improved fast lock PLL and method which maintains an output phase shift of less than about five degrees when switching between wide and narrow bandwidth.

This invention results from the realization that an improved fast lock PLL and method can be achieved with a fast locking PLL that uses a wide bandwidth for frequency shifting and a narrow bandwidth for normal operation where the transition from the wide bandwidth to narrow bandwidth is sequenced in two steps such that the resistance of the loop filter is increased only after the charge pump current has been reduced to a nominal value so that the disturbance to the settled phase is minimized.

This invention features a fast lock phase lock loop (PLL) with minimal phase disturbance when switching from wide bandwidth mode to narrow bandwidth mode including a phase frequency detector, a charge pump, a loop filter and a voltage controlled oscillator, and a sequencer circuit for, at a first time, initiating an increase in the charge pump current to increase the loop gain to widen the loop bandwidth and initiating a decrease in the resistance in the loop filter to increase the phase margin of the PLL in the wide bandwidth mode; at a second time, initiating a reduction in the charge pump current to reduce the loop gain and bandwidth, and; at a third time, initiating an increase in said resistance first resistor values in the loop filter to increase the phase margin of the PLL in the narrow bandwidth mode.

In one embodiment, the sequencer circuit may initiate the reduction in the charge pump current to restore the loop gain and bandwidth at the second time. The sequencer circuit may initiate the reduction in the charge pump current to reduce the loop gain and bandwidth after the PLL has approached a steady state phase and frequency. The sequencer circuit may initiate the increase in the resistance in the loop filter after the charge pump current has approached a predetermined final value at the third time. The sequencer circuit may initiate a further decrease in the resistance in the loop filter at the first time to maintain phase margin of the PLL and may initiate an increase in the resistance in the loop filter at a fourth time to increase the phase margin of the PLL. The sequencer circuit may include a charge pump time-out circuit responsive to a reset signal and a reference clock signal for initiating the increase in the charge pump current in response to the reset signal at the first time and for reducing the charge pump current after a predetermined number of transitions of the reference clock signal at the second time. The charge pump time-out circuit may increase the charge pump current by enabling a plurality of charge pump units. The charge pump time-out circuit may decrease the charge pump current by disabling a number of the plurality of charge pump units. The sequencer circuit may include a first switch time-out circuit responsive a reset signal and a reference clock signal for enabling a first switching device connected to first resistors in the loop filter to decrease the resistance in the loop filter in response to the reset signal at the first time and for enabling the first switching device to increase the resistance in the loop filter after a predetermined number of transitions of the reference clock signal at the third time. The first switch time-out may enable a second switching device connected to second resistors in the loop filter for decreasing the resistance in the loop filter in response to the reset signal at the first time and increasing the resistance in the loop filter after a predetermined number of transitions of said reference clock signal a fourth time. The sequencer circuit may further include a second switch time-out circuit responsive to the reset signal and the reference clock signal for enabling a second switching device connected to second resistors in the loop filter to further decrease the resistance in the loop filter in response to the reset signal at the first time and for enabling the second switching device to increase the resistance in the loop filter after predetermined number of transitions of the reference clock signal at the fourth time. The fast lock PLL may maintain a phase lock stability to within about five degrees when switching from the wide bandwidth to the narrow bandwidth.

This invention further features a fast lock phase lock loop (PLL) with minimal phase disturbance when switching from wide bandwidth mode to narrow bandwidth mode including a phase frequency detector, a charge pump, a loop filter and a voltage controlled oscillator, and a sequencer circuit for, at a first time, initiating an increase in the charge pump current to increase the loop gain to widen the loop bandwidth and initiating a decrease in the resistance in the loop filter to maintain the phase margin in the PLL in the wide bandwidth mode; at a second time, after the PLL has sufficiently approached a steady state phase and frequency, initiating a reduction in the charge pump current to restore the loop gain and bandwidth, and; at a third time, after the charge pump current has approached a predetermined final value, initiating an increase in the resistance in the loop filter to increase the phase margin of the PLL in the narrow bandwidth mode.

The invention also features a fast lock phase lock loop (PLL) with minimal phase disturbance when switching from wide bandwidth mode to narrow bandwidth mode including a phase frequency detector, a charge pump, a loop filter and a voltage controlled oscillator, and a sequencer circuit including a charge pump time-out circuit for, at a first time, initiating an increase in the charge pump current to increase the loop gain to widen the loop bandwidth and a switch time-out circuit for, at the first time, initiating a decrease in the resistance in the loop filter to maintain a phase margin in the PLL in the wide bandwidth mode; at a second time, the charge pump time-out circuit initiating a reduction in the charge pump current to reduce the loop gain and bandwidth, and; at a third time, the switch time-out circuit initiating an increase in the resistance in the loop filter to increase the phase margin of the PLL in the narrow bandwidth mode.

This invention also features a fast locking dual bandwidth phase lock loop (PLL) including a phase frequency detector, a charge pump, a loop filter and a voltage controlled oscillator, and a sequencer circuit for, at a first time, initiating an increase in the charge pump current to increase the loop gain to widen the loop bandwidth and initiating a decrease in the resistance in the loop filter to maintain a phase margin in the PLL; at a second time, initiating a reduction in the charge pump current to reduce the loop gain and bandwidth, and; at a third time, initiating an increase in the resistance in the loop filter to increase the phase margin of the PLL.

This invention further features a method for fast locking a phase lock loop (PLL) including the steps of: at a first time, increasing the charge pump current to increase the loop gain to widen the loop bandwidth, decreasing the resistance in a loop filter resistance to maintain a phase margin in the PLL at the first time, at a second time, reducing the charge pump current to reduce loop gain and bandwidth, and at a third time, increasing the resistance in the loop filter to increase the phase margin of the PLL.

In one embodiment, the method may further include the step of further increasing the resistance in the loop filter to increase the phase margin of the PLL.

This invention further features a method for fast locking a phase lock loop (PLL) including the steps of at a first time, increasing the charge pump current to increase the loop gain to widen the loop bandwidth, decreasing the resistance in a loop filter to maintain a phase margin in the PLL at the first time, allowing the phase lock loop to approach a steady state phase and frequency, at a second time, restoring the charge pump current to restore the loop gain and bandwidth, allowing the charge pump current to approach a final predetermined value, and at a third time, increasing the resistance in the loop filter to increase the phase margin of the PLL.

In one embodiment, the method may further include the step of increasing second resistor values in the loop filter to increase the phase margin of the PLL.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
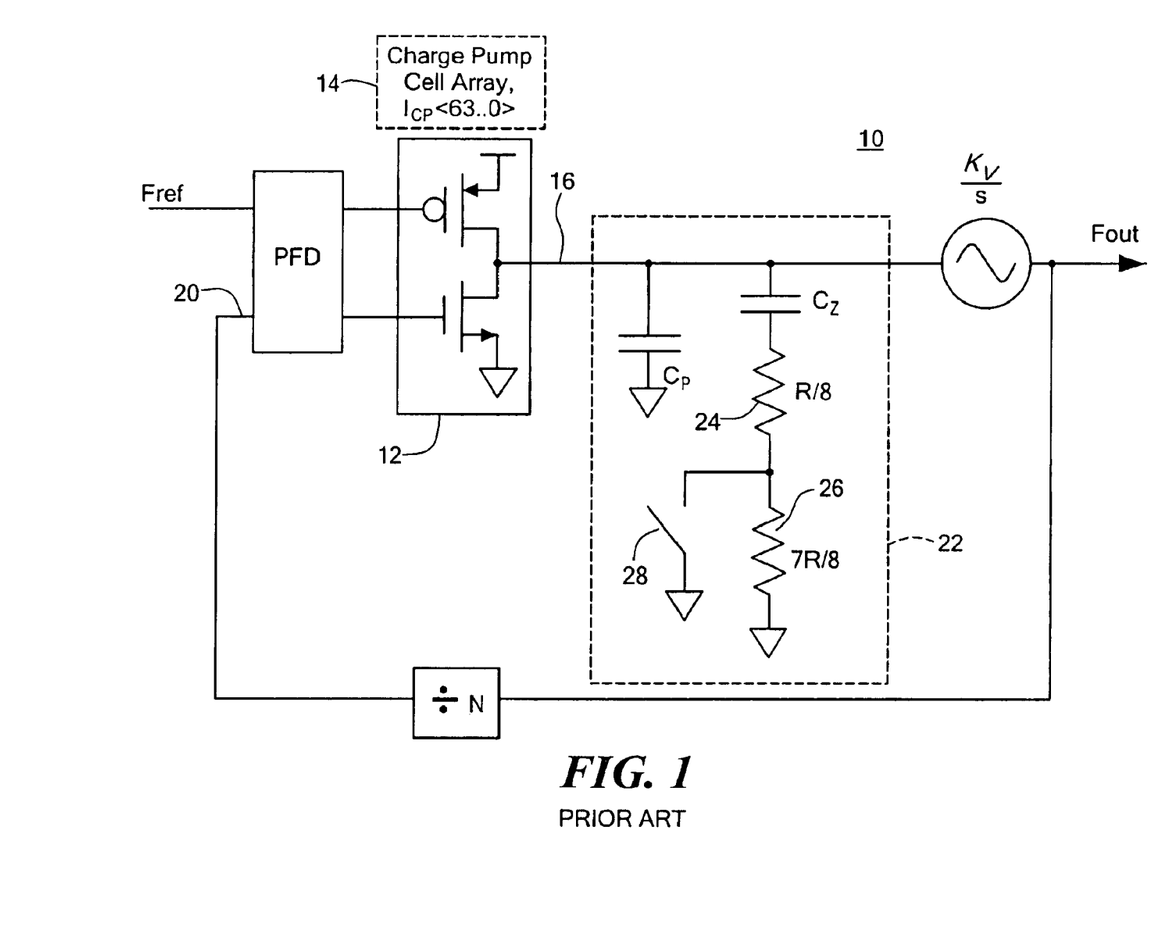
FIG. 1 is a schematic block diagram of a prior art fast lock PLL.

As discussed in the Background section above, conventional PLL 10, FIG. 1, switches from narrow bandwidth mode to wide bandwidth mode by increasing the charge pump current on line 16 output by charge pump 12 by a factor of N to increase the loop gain and widen the loop bandwidth of PLL 10 by a factor of the $\sqrt{N}$. For example, charge pump 12 may include plurality 14 of 64 charge pump units which are enabled to increase the charge pump current on line 16 by a factor of 64. In order to maintain the phase margin in the wide bandwidth mode at approximately 45 degrees for optimum settling PLL 10 reduces the resistance in loop filter 22 by a factor of $\sqrt{N}$, e.g., by a factor of 8. For example, PLL 10 may enable switching device 28 to close which reduces the resistance of the combination of resistors 24 and 26 by a factor of 8. Once the frequency of the reference signal ($F_{REF}$) on line 18 is locked to a sub-multiple of the output signal ($F_{OUT}$) on line 20, PLL 10 switches back to narrow bandwidth mode for normal operation. To return to narrow bandwidth mode, conventional PLL 10 reduces the charge pump current on line 16 by a factor of N (e.g., from 64 to 1) and, at the same time and in one step, increases the resistance in the loop filter by $\sqrt{N}$ (e.g., 8) to maintain the phase margin in the narrow bandwidth mode. Typically, PLL 10 disables 63 of the plurality 14 of 64 charge pump units to reduce the charge pump current on line 16 by a factor of 64 which reduces the bandwidth of PLL 10 by a factor of 8. At the same time, PLL 10 enables switching device 28 to open which increases the resistance of the combination of resistors 24 and 26 in loop filter 22 by a factor of 8. However, because PLL 10 reduces the charge pump current on line 16 and increases the resistance in loop filter 22 at the same time and in one step the charge pump current on line 16 is not allowed to approach a minimal value. The result is PLL 10 generates excessive phase disturbance and an output phase shift that typically exceeds five degrees.

However, as discussed above, when switching from wide bandwidth mode to narrow bandwidth mode, conventional PLL 10 reduces the charge pump current on line 16 and at the same time and in one step increases the resistance in loop filter 22. The disadvantage of this approach is that the charge pump current cannot reach a minimal value before the loop filter resistance is increased. The result is PLL 10 generates excessive phase disturbance and an output phase shift which exceeds five degrees.

Figure 2:
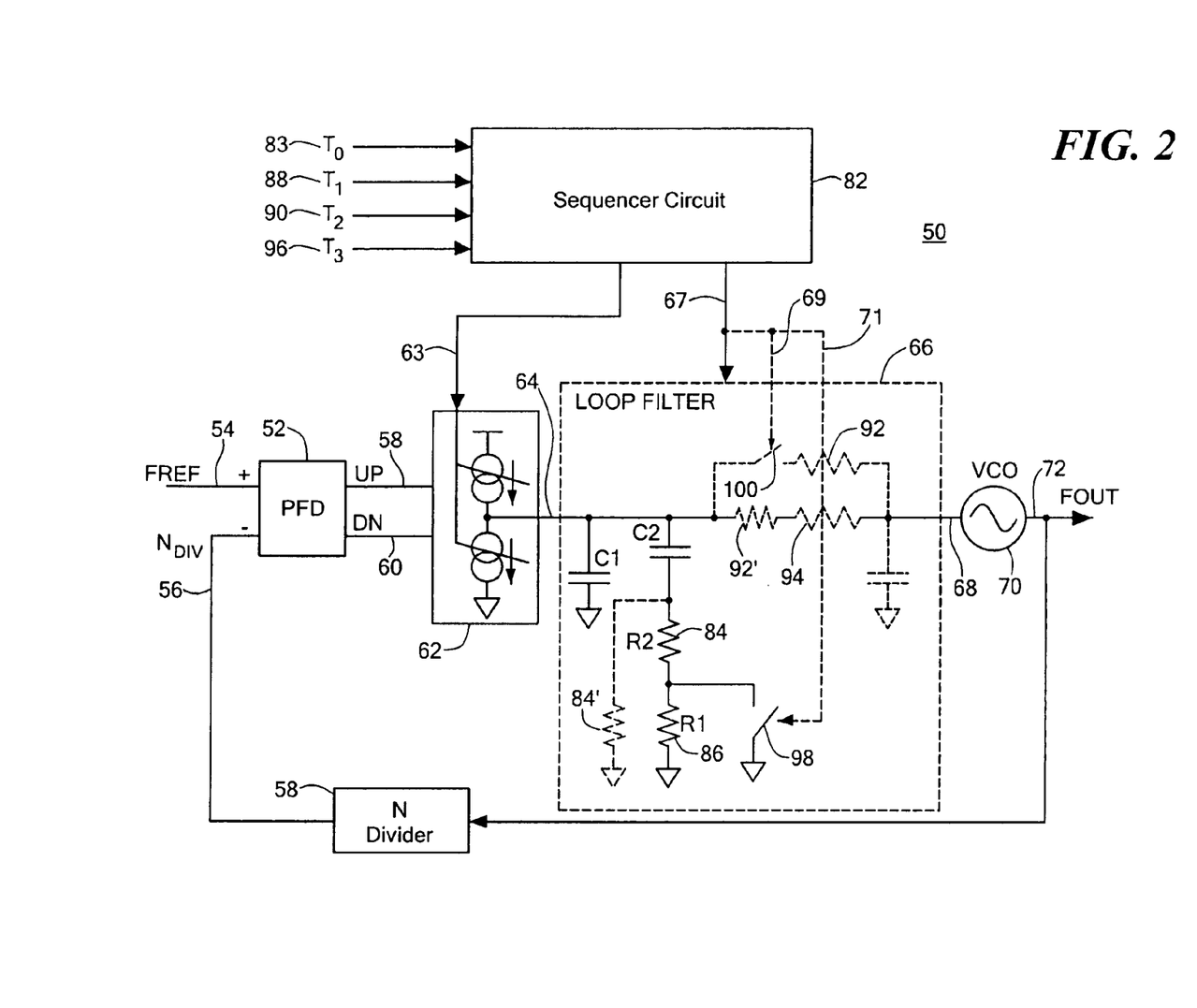
FIG. 2 is a schematic block diagram of one embodiment of the fast lock PLL of this invention.

In contrast, fast lock phase lock loop (PLL) 50, FIG. 2, of this invention minimizes the phase disturbance and output phase shift when switching from wide to narrow bandwidth mode. Fast lock PLL 50 sequences in two separate steps: 1) the reduction of the charge pump current to reduce the bandwidth of PLL 50 and 2) the increase in loop filter resistance to increase phase margin in narrow bandwidth mode. Because two separate steps are used the charge pump current is allowed to approach a minimal value before the resistance in loop filter 66 is increased. The result is that the phase disturbance is minimized and the output phase shift is less than about five degrees.

Figure 3:
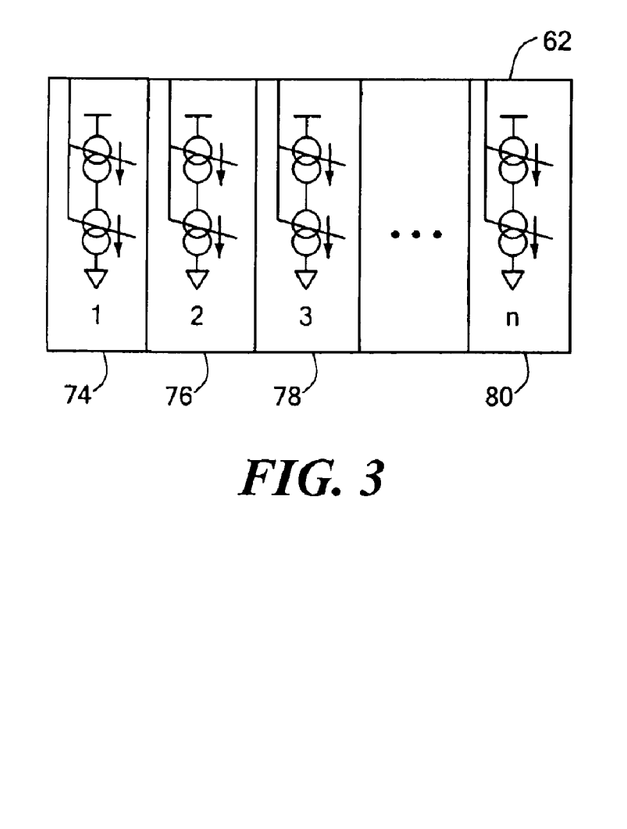
FIG. 3 is a schematic block diagram showing one example of the charge pump shown in FIG. 2 employing a plurality of charge pump units for increasing and decreasing the charge pump current.

Fast lock PLL 50 includes phase frequency detector (PFD) 52 responsive to a reference frequency signal, $F_{REF}$, on line 54 and a sub-multiple of an output frequency signal, $N_{DIV}$ on line 56. The sub-multiple of the output frequency signal ($N_{DIV}$) on line 56 is typically generated with N-divider circuit 58 which divides $F_{OUT}$ by N. PFD 52 compares the frequency of $F_{REF}$ on line 54 to the frequency of $N_{DIV}$ on line 56 to determine if the frequency of $N_{DIV}$ needs to be increased or decreased to lock the frequency of $N_{DIV}$ to $F_{REF}$. PFD 12 generates frequency up pulses on line 58 or frequency down pulses on line 60 which is applied to charge pump 62. Charge pump 62 generates current on line 64 (e.g., up and down current pulses) which is applied to loop filter 66. Similar as described above in reference to FIG. 1, charge pump 62, FIG. 2 may include a plurality of charge pump units, such as charge pump units 74, 76, 78 and 80 as shown in FIG. 3 (e.g., 64 charge pump units) which are used to increase and/or decrease the charge pump current on line 64, as discussed below. Loop filter 66 generates voltages on line 68 which is applied to VCO 70. VCO 70 then increases or decreases the frequency of $F_{OUT}$ on line 72 in order to lock (settle) the frequency of $F_{REF}$ to $N_{DIV}$.

Fast lock PLL 50 includes sequencer circuit 82 which initiates, by line 63, at a first time, an increase in the charge pump current on line 64. Typically the charge pump current is then increased by a factor of N (e.g., 64) to increase the loop gain and increase the bandwidth of PLL by a factor of $\sqrt{N}$ (e.g., 8) as described above. At the first time, sequencer circuit 82 also initiates loop filter 66 by line 67 to decrease the resistance in loop filter 66 by a factor of $\sqrt{N}$ (e.g., 8) which increases the phase margin of PLL 50 in the wide bandwidth mode. For example, at time $T_0$, indicated at 83, the charge pump current on line 64 is increased by a factor of 64 by enabling 64 charge pump units as discussed above in reference to FIG. 3 which increases the loop gain and widens the bandwidth of PLL 50 by a factor of 8. Also, at time $T_0$, sequencer circuit 82 enables switching device 98 connected to resistors 84 and 86 by line 71 to close which decreases the resistance of the combination of resistors 84 and 86 in loop filter 66 by a factor of 8.

To switch from wide bandwidth mode to narrow bandwidth mode, sequencer circuit 82, at a second time, $T_1$, indicated at 88, initiates charge pump 62 by line 63 to reduce the charge pump current on line 64 to reduce the loop gain by a factor of N which reduces the bandwidth of PLL 50 by $\sqrt{N}$. For example, the charge pump current on line 64 may be decreased by a factor of 64 to decrease the loop gain and reduce the bandwidth of PLL 50 by a factor of 8.

Figure 4:
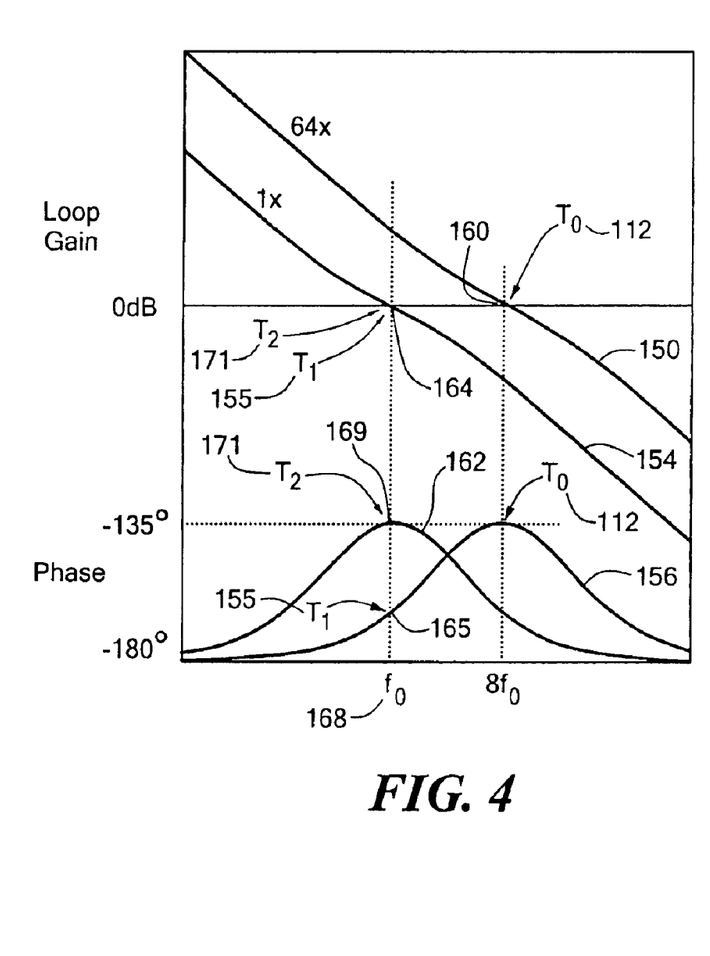
FIG. 4 is a Bode Plot showing the gain and phase response of the PLL shown in FIG. 2.

FIG. 4 is a Bode plot showing an example of the gain and phase of fast lock PLL 50 of this invention. In this example, curve 150 shows the loop gain magnitude of PLL 50 in the wide bandwidth mode after the charge pump current has been increased at time $T_0$, indicated at 152. Curve 154 shows the loop gain magnitude of PLL 50 in the narrow bandwidth mode after the charge pump current has been decreased at time $T_1$, indicated at 155. Curve 156 shows the loop gain phase which corresponds to the loop gain magnitude shown in curve 150 at 0 dB (e.g., a gain of 1), indicated at 160 at time $T_0$. Curve 162 shows the loop gain phase which corresponds to the loop gain magnitude shown in curve 154 at 0 dB (e.g., a gain of 1), indicated at 164 at time $T_1$. The operating points for loop gain and phase after the $T_1$, indicated at 155, are shown at 164 and 165 respectively. The 0 dB loop gain, indicated at 164, is back at $f_0$, indicated at 168. Hence, while the phase margin is reduced it will always be positive and the loop will not become unstable.

At a third time, $T_2$, FIG. 3, indicated at 90, sequencer circuit 82 initiates by line 67 an increase in the resistance of loop filter 66 to increase the phase margin of PLL 50 in the narrow bandwidth mode to approximately 45 degrees to give a more optimum closed loop response during narrow bandwidth mode. Similarly, FIG. 4 show the operating points, indicated at 164 and 169, for the loop gain and phase, respectively, after the third time, $T_2$, indicated at 171. Typically, at the third time, $T_2$, sequencer circuit 82, FIG. 3, enables switching device 98 connected to resistors 84 and 86 by line 71 to open which increases the resistance of the combination of resistors 84 and 86 in loop filter 66 by a factor of 8.

Because fast lock PLL 50 sequences the decrease the charge pump current on line 64 and the increase the resistance in loop filter 66 at two different times, e.g., $T_1$ and $T_2$, the charge pump current on line 64 is allowed to approach a minimal value before the resistance in loop filter 66 is increased. Because the charge pump current on line 64 input to loop filter 66 is at a minimal value before the resistance in the loop filter is increased, the output voltage step on line on line 68 generated by loop filter 66 after the resistance in loop filter 66 is increased is also minimized. The result is that minimal phase disturbance is generated by fast lock PLL 50.

Although, as shown in FIGS. 2 and 3 sixty four charge pump units may be enabled or disabled to increase or decrease the charge pump current on line 64, by a factor of N this is not a necessary limitation of this invention, as any number of charge pump units may be enabled or disabled to increase or decrease the charge pump current on line 64 to increase or decrease the charge pump current by any factor of N. Similarly, the resistance in loop filter 66 may be increased or decreased by any factor of the $\sqrt{N}$.

At a first time, $T_0$, indicated at 83, sequencer circuit 82 may also decrease the resistance in loop filter 66 by enabling over line 69 switching device 100 connected to resistors 92 and 94 to close which decreases the combination of resistors 92 and 94 by a factor of $\sqrt{N}$, e.g., by a factor of 8. Similarly, at a fourth time, $T_3$, as indicated at 96, sequencer circuit 82 may increase the resistance in loop filter 66 by a factor of $\sqrt{N}$ to increase the phase margin of fast lock PLL 50 in wide bandwidth mode by enabling switching device 100 over line 69 to open. Opening switching device 100 increases the combination of resistors 92 and 94 in loop filter 66 by a factor of $\sqrt{N}$ (e.g., by a factor of 8).

Although as shown in FIG. 2 resistors 92 and 94 are connected in parallel and resistors 84 and 86 are connected in series, this is not a necessary limitation of this invention, as resistors 92 and 94 may be connected in series, as indicated by resistor 92' and resistor 94, and resistors 84 and 86 may be connected in parallel, as indicated by resistor 84' and resistor 86.

Figure 5:
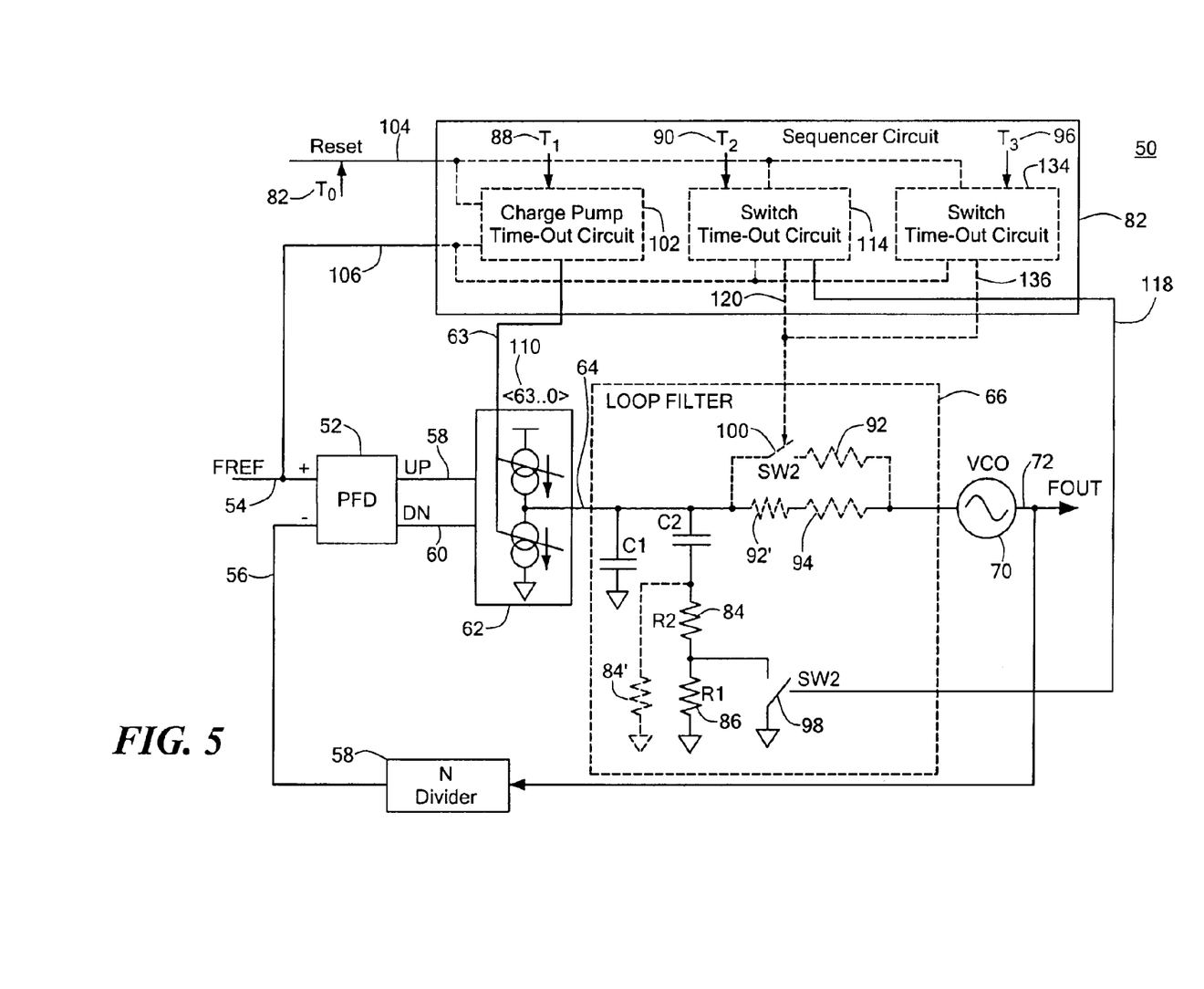
FIG. 5 is a schematic block diagram showing in further detail the components of the sequencer circuit shown in FIG. 2.

Sequencer circuit 82, FIG. 5, where like parts have been given like numbers, typically includes charge pump time-out circuit 102 responsive to a reset signal on line 104 and a reference clock signal ($F_{REF}$) on line 106. Charge pump time-out circuit 102 enables charge pump 62 by line 63 to increase the charge pump current on line 64 by a factor of N in response to a reset signal on line 104 at the first time $T_0$, indicated at 82. Charge pump time-out circuit 102 reduces the charge pump current by a factor of N after a predetermined number of transitions of the reference signal ($F_{REF}$) on line 106 at the second time $T_1$, indicated at 88. Similar as described above, the charge pump current on line 64 is typically increased by a factor of 64 at time $T_0$ with charge pump time-out circuit 102 by enabling a plurality 110 of 64 charge pump units to increase the loop gain and increase the bandwidth of fast lock PLL 50 by a factor of 8. The charge pump current on line 64 may be decreased by a factor of 64 at the second time $T_1$, indicated at 88 with charge pump time-out circuit 102 by disabling 63 of the plurality 110 of 64 charge pump units to decrease the loop gain and decrease the bandwidth of fast lock PLL 50 by a factor of 8.

Sequencer circuit 82 also includes switch time-out circuit 114 responsive to the reset signal on line 104 and the reference signal ($F_{REF}$) on line 106. Switch time-out circuit 114 enables switching device 98 by line 118 connected to resistors 84 and 86 to decrease the resistance in loop filter 66 by $\sqrt{N}$ (e.g., by a factor of 8) in wide bandwidth mode in response to the reset signal on line 104 at the first time $T_0$, indicated at 88. For example, closing switching device 98 reduces the resistance of the combination of resistors 84 and 86 by a factor of 8. Similarly, switch time-out circuit 114 enables switching device 100 by line 120 connected to resistors 92 and 94 to decrease the resistance in loop filter 66 by a factor of $\sqrt{N}$ in response to the reset signal on line 104 at the first time, $T_0$, indicated at 88. Typically, closing switching device 100 at time $T_0$ reduces the resistance of the combination of resistors 92 and 94 by a factor of 8.

Switch time-out circuit 114 also enables switching device 98 by line 118 to increase the resistance in loop filter 66 by $\sqrt{N}$ to increase the phase margin of PLL 50 in the narrow bandwidth mode after a predetermined number of transitions of the reference clock signal on line 106 at the third time, $T_2$, indicated at 90. Typically, switch time-out circuit 114 opens switching device 98 at the third time, $T_2$, which increases the resistance of the combination of resistors 84 and 86 by a factor of 8. Fast lock PLL 50 also includes switch time-out circuit 134 which enables switching device 100 by line 136 to increase the resistance in loop filter 66 by $\sqrt{N}$ and increase the phase margin of PLL 50 in narrow bandwidth mode by opening switching device 100 after a predetermined number of transitions of the reference signal on line 106 at a fourth time, $T_3$, indicated at 96. Similarly, opening switching device 100 at the forth time, $T_3$, increases the resistance of the combination of resistors 92 and 94 by $\sqrt{N}$, e.g., by a factor of 8.

Figure 6:
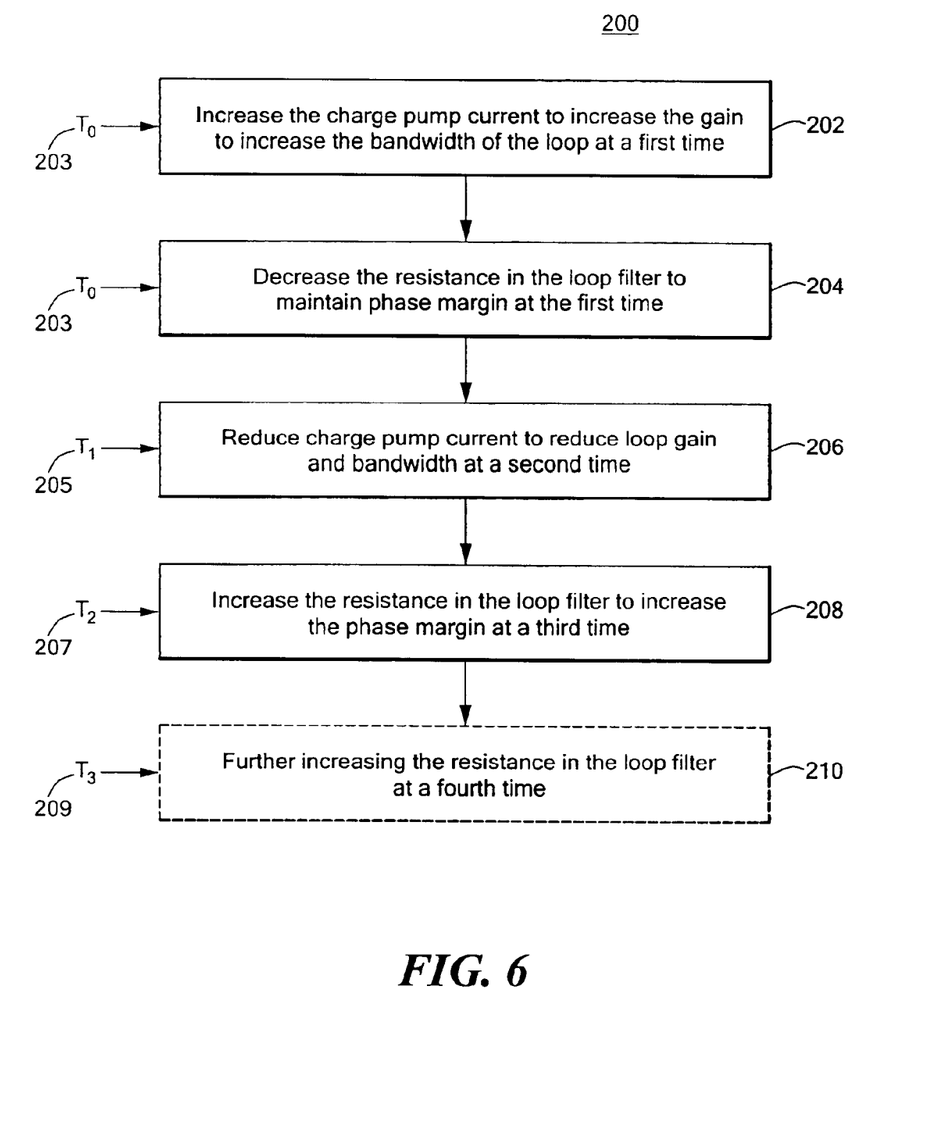
FIG. 6 is a schematic block diagram of one example of the method of fast locking a phase lock loop in accordance with this invention.

Method 200, FIG. 6, for fast locking of a phase lock loop (PLL) of this invention includes the steps of increasing the charge pump current to increase the loop gain to widen the loop bandwidth at a first time, $T_0$, indicated at 203, step 202. At the first time $T_0$, the resistance in the loop filter is decreased to maintain a phase margin in the PLL, step 204. At a second time, $T_1$, indicated at 205, the charge pump current is reduced to reduce loop gain and bandwidth, step 206. At a third time, $T_2$, indicated at 207, the resistance in the loop filter is increased to increase the phase margin of the PLL, step 208. In one example, method 200 may also include the step of further increasing the resistance in the loop filter to increase the phase margin of the PLL at a fourth time, $T_3$, indicated at 209, step 210.

Figure 7:
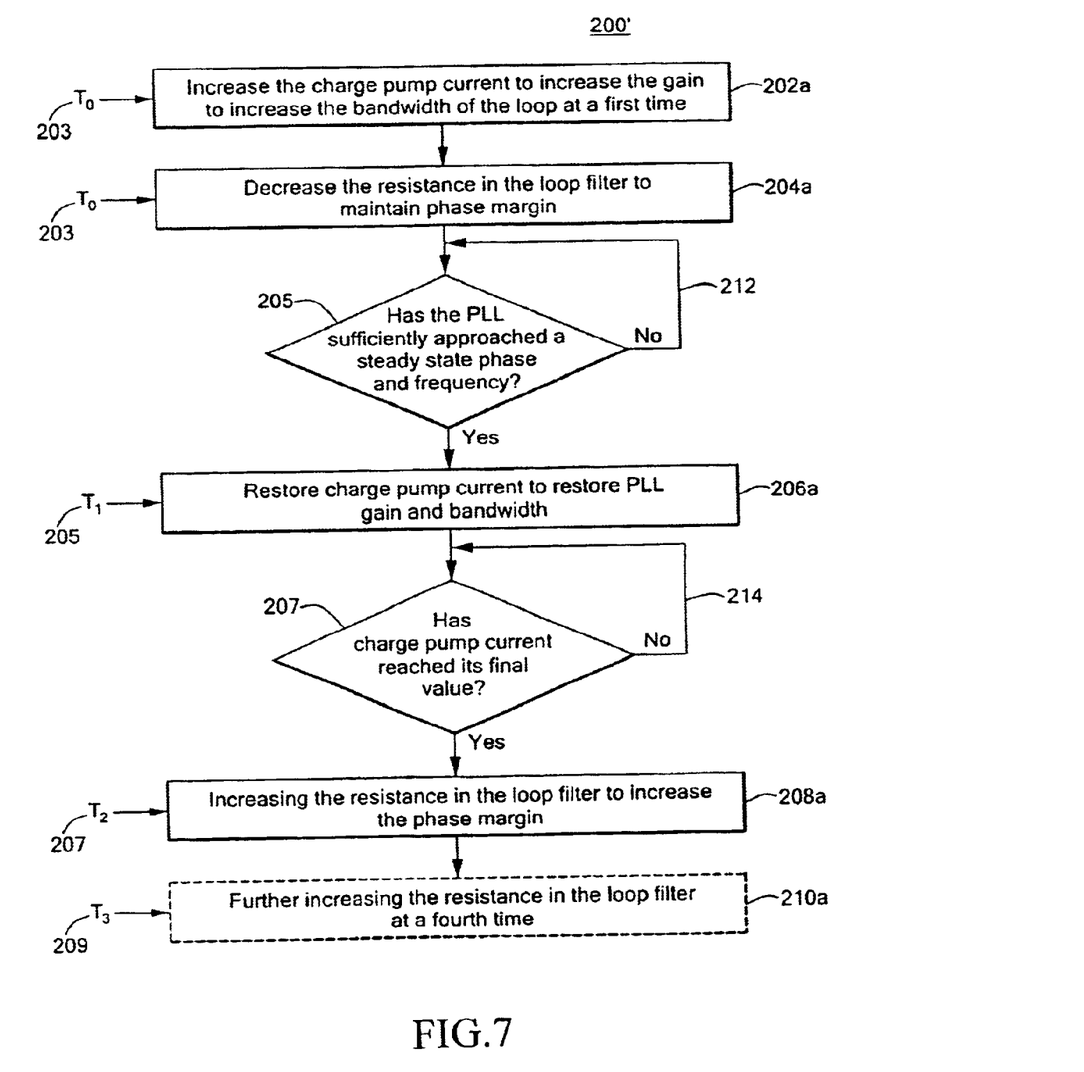
FIG. 7 is a schematic block diagram of another example of the method of fast locking a phase lock loop of this invention.

Method 200', FIG. 7 for fast locking of a phase lock loop (PLL) of this invention includes the step of increasing the charge pump current to increase the loop gain to widen the loop bandwidth at a first time, $T_0$, indicated at 204, step 202a. At the first time, $T_0$, the resistance in the loop filter is decreased to maintain a phase margin in the PLL, step 204a. Step 205 includes allowing the PLL to approach a steady state phase and frequency. If a steady state phase and frequency is not sufficiently approached, step 205 is repeated, as indicated by line 212. Once the steady state phase and frequency is sufficiently approached, at a second time, $T_1$, indicated at 205, the charge pump current is restored (reduced) to restore loop gain and bandwidth, step 206a. The charge pump current is then allowed to approach a predetermined final value, e.g., a minimal value, step 207. If the charge pump current has not approached the predetermined final value, step 207 is repeated, as indicated by line 214. At a third time, $T_2$, indicated at 207, the resistance in the loop filter is increased to increase the phase margin of the PLL, step 208a. In one example, method 200' may also include the step of further increasing the resistance in the loop filter to increase the phase margin of the PLL at a fourth time, $T_3$, indicated at 207, step 210a.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A fast lock phase lock loop (PLL) with minimal phase disturbance when switching from wide bandwidth mode to narrow bandwidth mode comprising:
   a phase frequency detector, a charge pump, a loop filter and a voltage controlled oscillator; and
   a sequencer circuit for, at a first time, initiating an increase in charge pump current to increase loop gain to widen loop bandwidth and initiating a decrease in resistance of said loop filter to increase phase margin of said PLL in said wide bandwidth mode; at a second time, initiating a reduction in said charge pump current to reduce said loop gain and bandwidth, and; at a third time, initiating an increase in said resistance in said loop filter to increase the phase margin of said PLL in said narrow bandwidth mode.

2. The fast lock PLL of claim 1 in which said sequencer circuit initiates said reduction in said charge pump current to restore said loop gain and bandwidth at said second time.

3. The fast lock PLL of claim 1 in which said sequencer circuit initiates said reduction in said charge pump current to reduce said loop gain and bandwidth after said PLL has approached a steady state phase and frequency.

4. The fast lock PLL of claim 1 in which said sequencer circuit initiates said increase in said resistance in said loop filter after said charge pump current has approached a predetermined final value at said third time.

5. The fast lock PLL of claim 1 in which said sequencer circuit initiates a further decrease in said resistance in said loop filter at said first time to maintain phase margin of said PLL and initiates an increase in said resistance in said loop filter at a fourth time to increase said phase margin of said PLL.

6. The fast lock PLL of claim 1 in which said sequencer circuit includes a charge pump time-out circuit responsive to a reset signal and a reference clock signal for initiating said increase in said charge pump current in response to said reset signal at said first time and for reducing said charge pump current after a predetermined number of transitions of said reference clock signal at said second time.

7. The fast lock PLL of claim 6 in which said charge pump time-out circuit increases said charge pump current by enabling a plurality of charge pump units.

8. The fast lock PLL of claim 7 in which said charge pump time-out circuit decreases said charge pump current by disabling a number of said plurality of charge pump units.

9. The fast lock PLL of claim 1 in which said sequencer circuit includes a first switch time-out circuit responsive a reset signal and a reference clock signal for enabling a first switching device connected to first resistors in said loop filter to decrease said resistance in said loop filter in response to said reset signal at said first time and for enabling said first switching device to increase said resistance in said loop filter after a predetermined number of transitions of said reference clock signal at said third time.

10. The fast lock PLL of claim 9 in which said first switch time-out circuit enables a second switching device connected to second resistors in said loop filter for decreasing said resistance in said loop filter in response to said reset signal at said first time and increasing said resistance in said loop filter after a predetermined number of transitions of said reference clock signal at a fourth time.

11. The fast lock PLL of claim 10 in which said sequencer circuit further includes a second switch time-out circuit responsive to said reset signal and said reference clock signal for enabling said second switching device connected to said second resistors in said loop filter to further decrease said resistance in said loop filter in response to said reset signal at said first time and for enabling said second switching device to increase said resistance in said loop filter after predetermined number of transitions of said reference clock signal at said fourth time.

12. The fast lock PLL of claim 1 in which said fast lock PLL maintains a phase lock stability to within about five degrees when switching from said wide bandwidth to said narrow bandwidth.

13. A fast lock phase lock loop (PLL) with minimal phase disturbance when switching from wide bandwidth mode to narrow bandwidth mode comprising:
   a phase frequency detector, a charge pump, a loop filter and a voltage controlled oscillator; and
   a sequencer circuit for, at a first time, initiating an increase in charge pump current to increase loop gain to widen loop bandwidth and initiating a decrease in resistance in said loop filter to maintain phase margin in said PLL; in said wide bandwidth mode at a second time, after said PLL has sufficiently approached a steady state phase and frequency, initiating a reduction in said charge pump current to restore said loop gain and bandwidth, and; at a third time, after said charge pump current has approached a predetermined final value, initiating an increase in resistance in said loop filter to increase the phase margin of said PLL in said narrow bandwidth mode.

14. A fast lock phase lock loop (PLL) with minimal phase disturbance when switching from wide bandwidth mode to narrow bandwidth mode comprising:
   a phase frequency detector, a charge pump, a loop filter and a voltage controlled oscillator; and
   a sequencer circuit including a charge pump time-out circuit for, at a first time, initiating an increase in a charge pump current to increase loop gain to widen loop bandwidth and a switch time-out circuit for, at said first time, initiating a decrease in resistance in said loop filter to maintain a phase margin in said PLL in said wide bandwidth mode; at a second time, said charge pump time-out circuit initiating a reduction in said charge pump current to reduce said loop gain and bandwidth, and; at a third time, said switch time-out circuit initiating an increase in resistance in said loop filter to increase the phase margin of said PLL in said narrow bandwidth mode.

15. A fast locking dual bandwidth phase lock loop (PLL) comprising:

a phase frequency detector, a charge pump, a loop filter and a voltage controlled oscillator; and a sequencer circuit for, at a first time, initiating an increase in charge pump current to increase loop gain to widen loop bandwidth and initiating a decrease in resistance in said loop filter to maintain phase margin in said PLL; at a second time, initiating a reduction in said charge pump current to reduce said loop gain and bandwidth, and; at a third time, initiating an increase in said resistance in said loop filter to increase the phase margin of said PLL.

16. A method for fast locking a phase lock loop (PLL) comprising the steps of:

at a first time, increasing charge pump current to increase loop gain to widen loop bandwidth;

decreasing resistance in a loop filter to maintain a phase margin in said PLL at said first time;

at a second time, reducing said charge pump current to reduce said loop gain and bandwidth; and at a third time, increasing said resistance in said loop filter to increase the phase margin of said PLL.

17. The method of claim 16 further including the step of further increasing resistance in said loop filter to increase said phase margin of said PLL.

18. A method for fast locking a phase lock loop (PLL) comprising the steps of:

at a first time, increasing the charge pump current to increase the loop gain to widen the loop bandwidth;

decreasing the resistance in said loop filter to maintain a phase margin in said PLL at said first time;

allowing said phase lock loop to sufficiently approach a steady state phase and frequency;

at a second time, restoring the charge pump current to restore the loop gain and bandwidth;

allowing the charge pump current to approach a final predetermined value; and at a third time, increasing said resistance in said loop filter to increase the phase margin of said PLL.

19. The method of claim 18 further including the step of further increasing resistance in said loop filter to increase said phase margin of said PLL.

* * * * *